US012665023B2

(12) United States Patent
Chen et al.

(10) Patent No.: US 12,665,023 B2
(45) Date of Patent: Jun. 23, 2026

(54) ELECTRONIC DEVICE

(71) Applicant: Advanced Semiconductor Engineering, Inc., Kaohsiung (TW)

(72) Inventors: Ying-Chung Chen, Kaohsiung (TW); Shih-Chieh Tang, Kaohsiung (TW); Lu-Ming Lai, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 91 days.

(21) Appl. No.: 18/628,554

(22) Filed: Apr. 5, 2024

(65) Prior Publication Data

US 2025/0316312 A1     Oct. 9, 2025

(51) Int. Cl.
*G11C 13/04* (2006.01)
*G02B 6/26* (2006.01)

(52) U.S. Cl.
CPC .............. *G11C 13/04* (2013.01); *G02B 6/264* (2013.01)

(58) Field of Classification Search
CPC ................................ G11C 13/04; G02B 6/264
See application file for complete search history.

(56) References Cited

U.S. PATENT DOCUMENTS

| | | | |
|---|---|---|---|
| 11,830,866 B2 | 11/2023 | Chen | |
| 2013/0308942 A1* | 11/2013 | Ji | H04B 10/801 |
| | | | 398/68 |
| 2016/0161686 A1* | 6/2016 | Li | G02B 6/4249 |
| | | | 385/92 |
| 2022/0365583 A1* | 11/2022 | Vijayrao | G11C 7/1054 |
| 2023/0326861 A1 | 10/2023 | Lin et al. | |

* cited by examiner

*Primary Examiner* — Min Huang
(74) *Attorney, Agent, or Firm* — Foley and Lardner LLP

(57) ABSTRACT

An electronic device is provided. The electronic device includes a first photonic component, a memory module, and a plurality of processing units. The memory module includes a plurality of memory components supported by the first photonic component. The processing units are distributed at a periphery of the memory module, wherein the memory module is configured to be accessed by at least two of the processing units through the first photonic component.

20 Claims, 9 Drawing Sheets

ELECTRONIC DEVICE

BACKGROUND

1. Technical Field

The present disclosure relates generally to an electronic device.

2. Description of the Related Art

Currently, with the increasing demand for high-speed computing, increased numbers of processors (e.g., CPU, GPU, or the like) and memories are integrated in one package. Generally, the processors and the memories may be separated into groups, and the processors are configured to access data in the memories within the same group. However, when the processors in a group stops operating, the memories in the same group are idle and not providing data access to the processors in other groups, which is disadvantageous to improving efficiency of high-speed computing.

SUMMARY

In one or more arrangements, an electronic device includes a first photonic component, a memory module, and a plurality of processing units. The memory module includes a plurality of memory components supported by the first photonic component. The processing units are distributed at a periphery of the memory module, wherein the memory module is configured to be accessed by at least two of the processing units through the first photonic component.

In one or more arrangements, an electronic device includes a memory module and a first processing unit. The memory module includes a plurality of memory components. The first processing unit is disposed adjacent to the memory module, wherein the first processing unit includes a first processing component and a second processing component configured to access different ones of the memory components through optical communication.

In one or more arrangements, an electronic device includes a carrier, a memory module, and a plurality of processing units. The memory module is over the carrier. The processing units are over the carrier, wherein the memory module is configured to be accessed by each of the processing units through optical communication.

BRIEF DESCRIPTION OF THE DRAWINGS

Aspects of the present disclosure are better understood from the following detailed description when read with the accompanying drawings. It is noted that various features may not be drawn to scale, and the dimensions of the various features may be arbitrarily increased or reduced for clarity of discussion.

Common reference numerals are used throughout the drawings and the detailed description to indicate the same or similar elements. The present disclosure will be more apparent from the following detailed description taken in conjunction with the accompanying drawings.

DETAILED DESCRIPTION

Figure 1A:
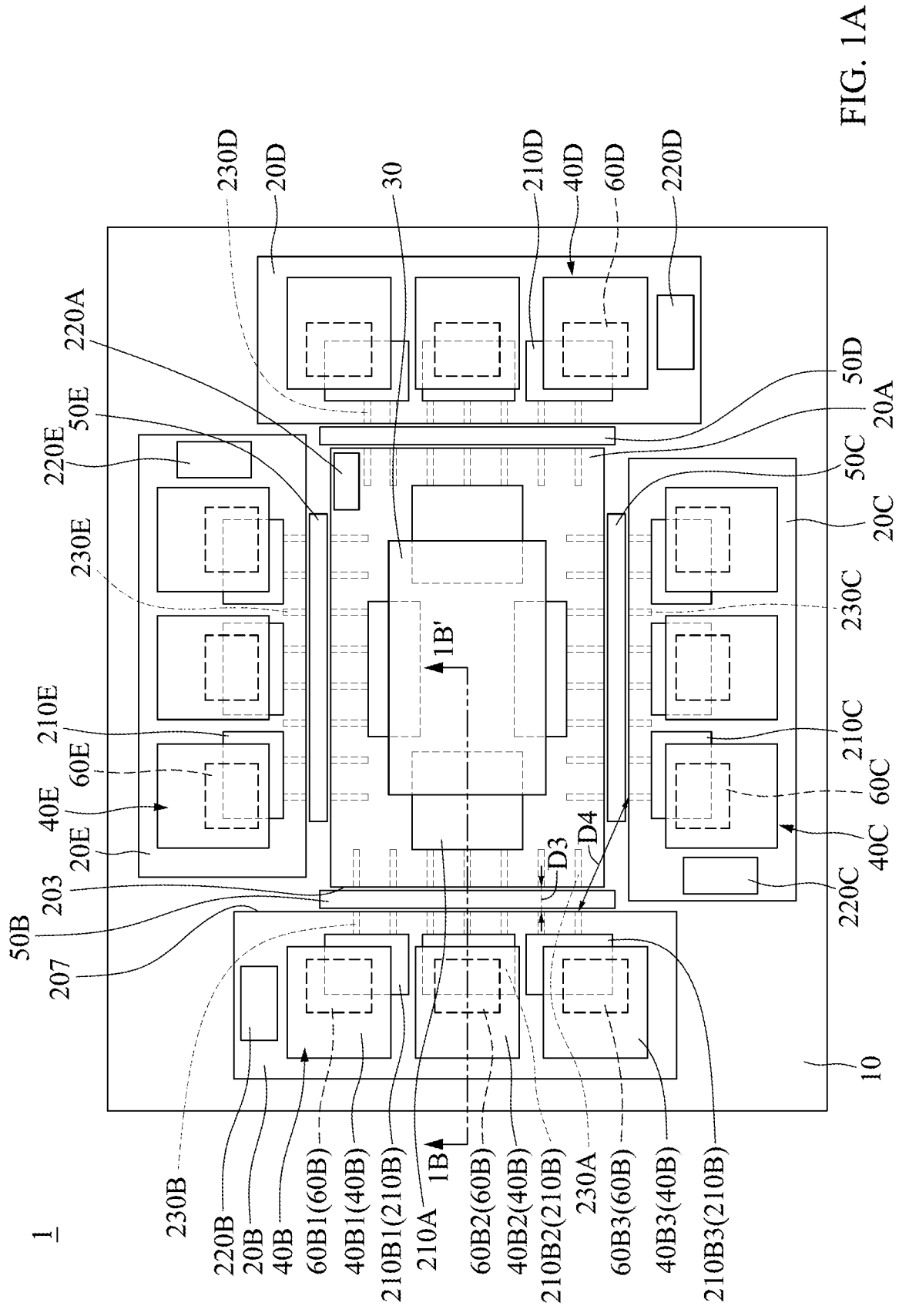
FIG. 1A is a top view of an electronic device in accordance with some arrangements of the present disclosure.
Figure 1B:
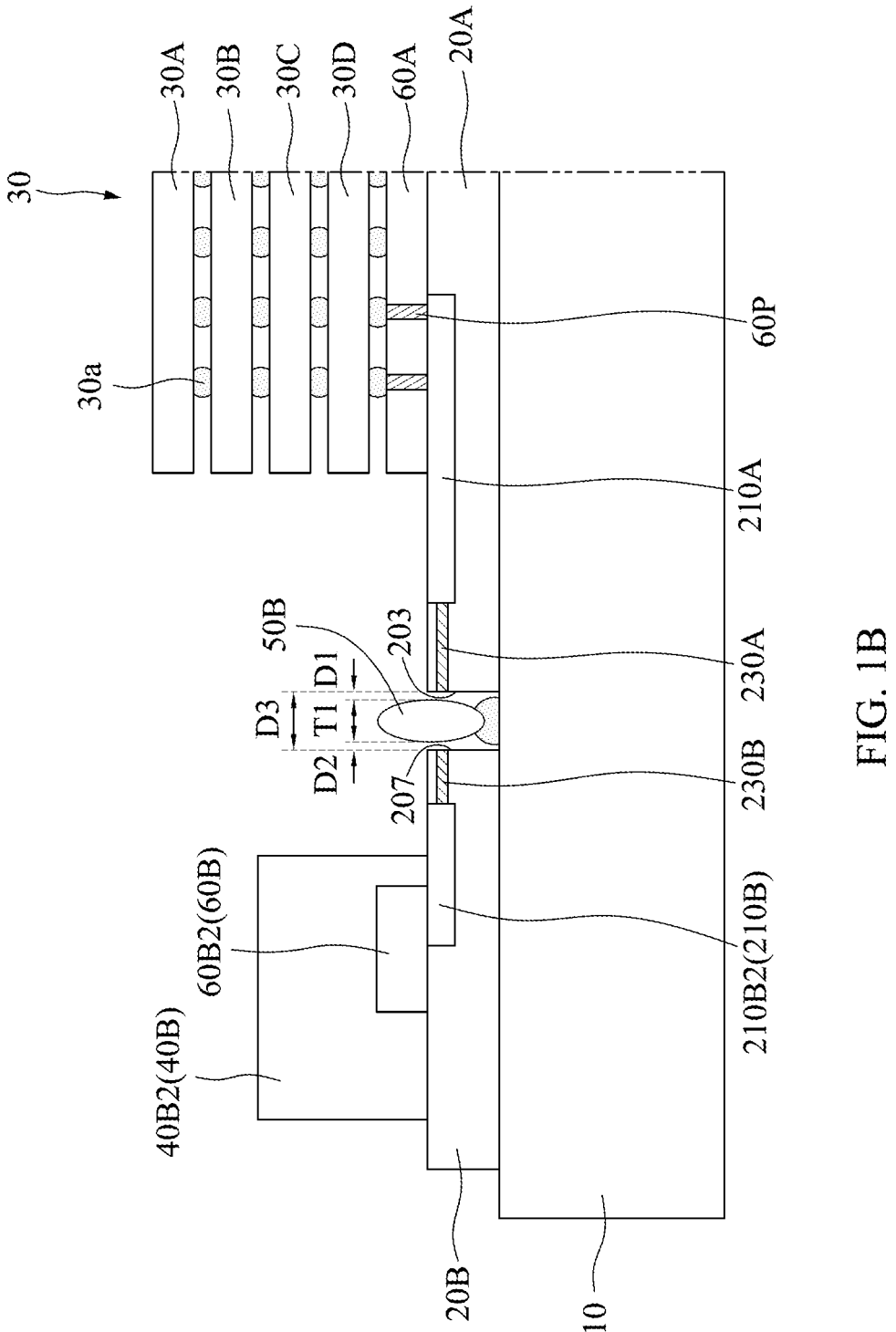
FIG. 1B is a cross-section of a portion of an electronic device in accordance with some arrangements of the present disclosure.

FIG. 1A is a top view of an electronic device 1 in accordance with some arrangements of the present disclosure. FIG. 1B is a cross-section of a portion of an electronic device 1 in accordance with some arrangements of the present disclosure. In some arrangements, FIG. 1B shows a cross-section along a line 1B-1B' in FIG. 1A. The electronic device 1 may include a carrier 10, photonic components 20A-20E, a memory module 30, processing units 40B-40E, optical connectors 50B-50E, and electronic components 60A-60E. It should be noted that the numbers of the photonic components, the processing units, the optical connectors, and the electronic components illustrated herein are merely examples, and the actual numbers of the above elements may vary according to actual applications and not limited thereto.

The carrier 10 may include, for example, a printed circuit board, such as a paper-based copper foil laminate, a composite copper foil laminate, or a polymer-impregnated glass-fiber-based copper foil laminate. The carrier 10 may include an interconnection structure, such as one or more conductive traces and/or one or more conductive through vias. The interconnection structure may include a redistribution layer (RDL) or a grounding element. In some arrangements, the carrier 10 includes a ceramic material or a metal plate. In some arrangements, the carrier 10 includes a substrate, such as an organic substrate or a leadframe. In some arrangements, the carrier 10 includes a two-layer substrate which includes a core layer and conductive layers and/or structures disposed on an upper surface and a bottom surface of the carrier 10. The conductive layers and/or structures may include a plurality of conductive traces.

The photonic components 20A, 20B, 20C, 20D, and 20E may be disposed over the carrier 10. The photonic components 20A, 20B, 20C, 20D, and 20E may be or include photonic integrated circuits (PICs). In some arrangements, the photonic components 20A, 20B, 20C, 20D, and 20E are configured to provide photoelectric conversion. In some arrangements, the photonic components 20A, 20B, 20C, 20D, and 20E are spaced apart from each other.

In some arrangements, the photonic component 20A supports and electrically connects to the memory module 30. In some arrangements, at least one of the photonic components 20B, 20C, 20D, and 20E supports and electrically connects to at least one of the processing units 40B, 40C, 40D, and 40E. In some arrangements, the photonic components 20B, 20C, 20D, and 20E are configured to optically couple to the photonic component 20A. In some arrangements, at least one of the photonic components 20B, 20C, 20D, and 20E is configured to communicatively couple at least one of the processing units 40B, 40C, 40D, and 40E to the memory module 30.

In some arrangements, the photonic component 20A includes at least one photoelectric conversion element 210A, an optical component 220A, and optical waveguides 230A. The photoelectric conversion element 210A may be configured to covert an electrical signal transmitted from the memory module 30 to an optical signal to optically couple to at least one of the processing units 40B, 40C, 40D, and 40E. The photoelectric conversion element 210A may be configured to covert an optical signal optically coupled from at least one of the photonic components 20B, 20C, 20D, and 20E to an electrical signal to electrically couple to the memory module 30. The photoelectric conversion element 210A may be or include a photodiode, a photodetector, an optical modulator (e.g., Mach-Zehnder modulator or microring modulator), or a combination thereof. In some arrangements, the optical component 220A is configured to provide an optical source signal to the photonic component 20A. The optical component 220A may be referred to as an optical source, which may include a laser diode. The optical waveguides 230A may be configured to transmit optical signals (e.g., light), for example, received from a laser diode, an optical fiber, or an optical fiber array. In some arrangements, at least one of the optical waveguides 230A is optically coupled to or contacting the photoelectric conversion element 210A. In some arrangements, at least one of the optical waveguides 230A is optically coupled to the optical component 220A. In some arrangements, a portion of the optical waveguide 230A is exposed by a surface 203 of the photonic component 20A. The photonic component 20A may further include a receiver, a semiconductor optical amplifier (SOA), a grating coupler, a fiber coupling structure (e.g., an optical fiber or an optical fiber array), or a combination thereof.

In some arrangements, the photonic component 20B includes one or more photoelectric conversion elements 210B, an optical component 220B, and optical waveguides 230B. In some arrangements, the photoelectric conversion elements 210B include elements (or "photoelectric conversion elements") 210B1, 210B2, and 210B3. The element 210B1 may be configured to covert an electrical signal transmitted from the processing component 40B1 to an optical signal to optically couple to the memory module 30. The element 210B1 may be configured to covert an optical signal optically coupled from the memory module 30 to an electrical signal to electrically couple to the processing component 40B1. The element 210B2 may be configured to covert an electrical signal transmitted from the processing component 40B2 to an optical signal to optically couple to the memory module 30. The element 210B2 may be configured to covert an optical signal optically coupled from the memory module 30 to an electrical signal to electrically couple to the processing component 40B2. The element 210B3 may be configured to covert an electrical signal transmitted from the processing component 40B3 to an optical signal to optically couple to the memory module 30. The element 210B3 may be configured to covert an optical signal optically coupled from the memory module 30 to an electrical signal to electrically couple to the processing component 40B3. In some arrangements, the optical signals converted by the elements 210B1, 210B2, and 210B3 are different from each other. In some arrangements, the electrical signals converted by the elements 210B1, 210B2, and 210B3 are different from each other. In some arrangements, at least two of the elements 210B1, 210B2, and 210B3 are configured to convert electrical signals from different processing components to optical signals different from each other to optically couple to the memory module 30. Each of the photoelectric conversion elements 210B may be or include a photodiode, a photodetector, an optical modulator (e.g., Mach-Zehnder modulator or microring modulator), or a combination thereof.

In some arrangements, the optical component 220B is configured to provide an optical source signal to the photonic component 20B. The optical component 220B may be referred to as an optical source, which may include a laser diode. The optical waveguides 230B may be configured to transmit optical signals (e.g., light), for example, received from a laser diode, an optical fiber, or an optical fiber array. In some arrangements, at least some of the optical waveguides 230B are optically coupled to or contacting the elements 210B1, 210B2, and 210B3, respectively. In some arrangements, the optical waveguides 230B optically couple the optical signals from the elements 210B1, 210B2, and 210B3 to the photoelectric conversion element 210A of the photonic component 20A, and then the photoelectric conversion element 210A is further configured to convert the received optical signals to electrical signals transmitted to the memory components of the memory module 30. In some arrangements, at least one of the optical waveguides 230A is optically coupled to the optical component 220B. In some arrangements, portions of the optical waveguides 230B are exposed by a surface 207 of the photonic component 20B. The photonic component 20B may further include a receiver, a semiconductor optical amplifier (SOA), a grating coupler, a fiber coupling structure (e.g., an optical fiber or an optical fiber array), or a combination thereof.

In some arrangements, a distance between an optical terminal (e.g., the optical waveguide 230A) of the memory module 30 and an optical terminal (e.g., the optical waveguides 230B, 230C, 230D, and/or 230E) of at least one of the processing units 40B, 40C, 40D, and 40E is less than a distance between optical terminals (the optical waveguides 230B, 230C, 230D, and 230E) of two of the processing units 40B, 40C, 40D, and 40E. For example, a distance D3 between the optical waveguide 230B and the optical waveguide 230A may be less than a distance D4 between the optical waveguide 230B and the optical waveguide 230C.

In some arrangements, the photonic component 20C includes one or more photoelectric conversion elements 210C, an optical component 220C, and optical waveguides 230C. In some arrangements, the photonic component 20D includes one or more photoelectric conversion elements 210D, an optical component 220D, and optical waveguides 230D. In some arrangements, the photonic component 20E includes one or more photoelectric conversion elements 210E, an optical component 220E, and optical waveguides 230E. The detailed structures and arrangements of elements of the photonic components 20C, 20D, and 20E may be the same as or similar to those of the photonic component 20B, and the description thereof is omitted hereinafter.

The memory module 30 may be disposed over the carrier 10. In some arrangements, the memory module 30 includes a plurality of memory components (e.g., memory components 30A, 30B, 30C, and 30D) supported by the photonic component 20A. In some arrangements, the memory components 30A, 30B, 30C, and 30D are stacked over each other. In some arrangements, the memory components 30A, 30B, 30C, and 30D are electrically connected to each other through connection elements 30a. The connection elements 30a may be or include conductive bumps, conductive pads, or soldering materials. In some arrangements, the memory module 30 is disposed between the at least two of the processing units. In some arrangements, the photonic component 20A supports and electrically connects to the memory module 30.

The processing units 40B, 40C, 40D, and 40E may be disposed over the carrier 10. In some arrangements, the processing units 40B, 40C, 40D, and 40E are distributed at a periphery of the memory module 30. In some arrangements, the processing units 40B, 40C, 40D, and 40E are disposed adjacent to the memory module 30. In some arrangements, the processing units 40B, 40C, 40D, and 40E surround the memory module 30 from a top view perspective. In some arrangements, the photonic component 20B supports and electrically connects to the processing unit 40B. In some arrangements, the photonic component 20C supports and electrically connects to the processing unit 40C. In some arrangements, the photonic component 20D supports and electrically connects to the processing unit 40D. In some arrangements, the photonic component 20E supports and electrically connects to the processing unit 40E. In some arrangements, each of the processing units 40B, 40C, 40D, and 40E includes one or more processing components. In some arrangements, the memory module 30 is configured to be accessed by at least two of the processing units 40B, 40C, 40D, and 40E through the photonic component 20A. In some arrangements, the memory module 30 is configured to be accessed by each of the processing units 40B, 40C, 40D, and 40E through optical communication. In some arrangements, each of the processing units 40B, 40C, 40D, and 40E is configured to access at least one of the memory components 30A, 30B, 30C, and 30D depending on a computing loading of the processing units 40B, 40C, 40D, and 40E.

In some arrangements, the processing unit 40B includes processing components 40B1, 40B2, and 40B3. In some arrangements, the processing component 40B1 is configured to transmit an electrical signal to the element 210B1 to be covered into an optical signal which may be optically coupled to the optical waveguide 230B. In some arrangements, the processing component 40B2 is configured to transmit an electrical signal to the element 210B2 to be covered into an optical signal which may be optically coupled to the optical waveguide 230B. In some arrangements, the processing component 40B3 is configured to transmit an electrical signal to the element 210B3 to be covered into an optical signal which may be optically coupled to the optical waveguide 230B. In some arrangements, at least two of the processing components 40B1, 40B2, and 40B3 are configured to access different memory components 30A, 30B, 30C, and 30D through optical communication.

The optical connectors 50B, 50C, 50D, and 50E may be disposed between the photonic component 20A and the photonic components 20B-20E. In some arrangements, the optical connectors 50B, 50C, 50D, and 50E are configured to optically couple the photonic component 20A to the photonic components 20B, 20C, 20D, and 20E, respectively. In some arrangements, the optical connectors 50B, 50C, 50D, and 50E are configured to passively optically align the photonic component 20A to the photonic components 20B, 20C, 20D, and 20E, respectively. In some arrangements, the optical connectors 50B, 50C, 50D, and 50E are configured to passively optically align the optical waveguide 230A of the photonic component 20A to the optical waveguides 230B, 230C, 230D, and 230E, respectively. In some arrangements, the optical connectors 50B, 50C, 50D, and 50E optically couple the photonic components 20B, 20C, 20D, and 20E, respectively, to the photonic component 20A by passive optical alignment. In some arrangements, a distance D1 between the optical connector 50B (or any one of the optical connectors 50C, 50D, and 50E) and the photonic component 20A is less than a thickness T1 of the optical connector 50B (or any one of the optical connectors 50C, 50D, and 50E). In some arrangements, the optical connectors 50B, 50C, 50D, and 50E may independently be or include a lens structure.

The electronic component 60A may be disposed over the photonic component 20A. In some arrangements, the electronic component 60A is electrically connected to the memory components 30A, 30B, 30C, and 30D. In some arrangements, the electronic component 60A is supported by the photonic component 20A. In some arrangements, the electronic component 60A includes conductive pillars 60P (or "conductive vias") which electrically connect to the memory components 30A, 30B, 30C, and 30D through the connection elements 30a. The electronic component 60A may have an active surface facing the photoelectric conversion element 210A and electrically connected to the memory components 30A, 30B, 30C, and 30D through the conductive pillars 60P. In some arrangements, the electronic component 60A is configured to control data communication between the processing units 40B, 40C, 40D, and 40E and the memory components 30A, 30B, 30C, and 30D to be accessed by the processing units 40B, 40C, 40D, and 40E. In some arrangements, the electronic component 60A is configured to determine amounts of data stored in the memory components 30A, 30B, 30C, and 30D to be accessed by the processing units 40B, 40C, 40D, and 40E depending on a computing loading of the processing units 40B, 40C, 40D, and 40E. In some arrangements, the electronic component 60A is connected to the photonic component 20A and configured to control signal communication between the at least one of the processing units 40B, 40C, 40D, and 40E and the memory module 30.

The electronic components 60B, 60C, 60D, and 60E may be disposed over the photonic components 20B, 20C, 20D, and 20E, respectively. In some arrangements, the electronic components 60B, 60C, 60D, and 60E are supported by the photonic components 20B, 20C, 20D, and 20E, respectively. In some arrangements, each of the electronic components 60B, 60C, 60D, and 60E is integrated into a processing component of one of the processing units 40B, 40C, 40D, and 40E. The electronic components 60B, 60C, 60D, and 60E may be or include electronic integrated circuits (EICs). The electronic components 60B, 60C, 60D, and 60E may independently include a modulator driver (DRV), a transimpedance amplifier (TIA), or a combination thereof. According to some arrangements of the present disclosure, the electronic component is integrated into the corresponding processing component over the photonic component, such that electrical connection paths between the electronic component and the processing component can be reduced, thus the non-optical transmission path can be reduced, and the signal loss during transmission can be reduced significantly.

In some arrangements, one or more of the electronic components 60B, 60C, 60D, and 60E supported by the photonic components 20B, 20C, 20D, and 20E may be configured to control data communication between the processing units 40B, 40C, 40D, and 40E and the memory components 30A, 30B, 30C, and 30D to be accessed by the processing units 40B, 40C, 40D, and 40E. In some arrangements, one or more of the electronic components 60A, 60B, 60C, 60D, and 60E may be configured to determine amounts of data stored in the memory components 30A, 30B, 30C, and 30D to be accessed by the processing units 40B, 40C, 40D, and 40E depending on a computing loading of the processing units 40B, 40C, 40D, and 40E. In some arrangements, one or more of the electronic components 60A, 60B, 60C, 60D, and 60E may be connected to the corresponding one or more of the photonic components 20A, 20B, 20C, 20D, and 20E and configured to control signal communication between the at least one of the processing units 40B, 40C, 40D, and 40E and the memory module 30.

In some arrangements, the electronic components 60B disposed over the photonic component 20B includes electronic components 60B1, 60B2, and 60B3 electrically connected to the processing components 40B1, 40B2, and 40B3, respectively. In some arrangements, the electronic components 60B1, 60B2, and 60B3 are integrated into the processing components 40B1, 40B2, and 40B3, respectively. In some arrangements, one or more of the electronic components 60B1, 60B2, and 60B3 are communicatively coupled to the electronic component 60A to determine which ones of the memory components 30A, 30B, 30C, and 30D to be accessed by the processing components 40B1, 40B2, and/or 40B3, respectively. The detailed structures and arrangements of elements of the electronic components 60C, 60D, and 60E may be the same as or similar to those of the electronic components 60B, and the description thereof is omitted hereinafter.

In some arrangements, the memory module 30 is disposed over a center region of the carrier 10, and the processing units 40B, 40C, 40D, and 40E are disposed over a peripheral region of the carrier 10. In some arrangements, the memory module 30 is configured to be accessed by two or more of the processing units 40B, 40C, 40D, and 40E distributed at a periphery of the memory module 30. According to some arrangements of the present disclosure, with the arrangements of the memory module 30 disposed at a center region and the processing units disposed at a peripheral region of the electronic device 1, signal transmission paths between the memory module and the processing units can be reduced significantly. Therefore, data transmission speed can be increased, power loss can be reduced, and the signal transmission quality and performance can be improved.

In some arrangements, all of the memory components 30A, 30B, 30C, and 30D are configured to be accessed by each of the processing units 40B, 40C, 40D, and 40E through optical communication. In some arrangements, when at least one of the processing units 40B, 40C, 40D, and 40E is not operated, all of the memory components 30A, 30B, 30C, and 30D are configured to be accessed by the other processing units 40B, 40C, 40D, and 40E that are operated. For example, when the processing unit 40B is not operated, all of the memory components 30A, 30B, 30C, and 30D are configured to be accessed by the processing units 40C, 40D, and 40E that are operated.

According to some arrangements of the present disclosure, the memory components 30A, 30B, 30C, and 30D disposed at a center region of the electronic device 1 can be accessed by each of the processing units 40B, 40C, 40D, and 40E disposed at a peripheral region of the electronic device 1, and thus no memory component would become idle even if one or more processing units are not operated. Therefore, data stored in all of the memory components can be accessed by all of the processing units that are operated, the memory efficiency can be increased, and the computing speed and the computing capacity of the electronic device 1 can be increased.

In addition, according to some arrangements of the present disclosure, the memory module 30 is configured to be accessed by each of the processing units 40B, 40C, 40D, and 40E through optical communication, for example, by optical waveguides 230A, 230B, 230C, 230D, and 230E. Therefore, the transmission speed provided by optical transmission is higher than that by electrical connection. Therefore, data access rate can be increased significantly, and thus the computing speed of the electronic device 1 can be increased significantly as well.

Moreover, according to some arrangements of the present disclosure, the optical connectors 50B, 50C, 50D, and 50E are configured to passively optically align the photonic component 20A to the photonic components 20B, 20C, 20D, and 20E, respectively. Therefore, the time and the cost for actively aligning the photonic components can be reduced. In addition, the optical connectors being or including lens structures (or the lenses) may have a relatively simple structure, less weight, and a relatively small volume, and thus the optical connectors only occupy relatively small volumes between the photonic component 20A and the photonic components 20B, 20C, 20D, and 20E. Therefore, the power loss is reduced significantly due to the reduced optical coupling distance, and thus the transmission efficiency can be increased.

In some arrangements, when two processing units have or are configured to have different computing loadings, the processing unit having or configured to have a higher computing loading may access more memory components, and preferably access the memory components that are most adjacent to the processing unit having or configured to have the higher computing loading. For example, when the processing unit 40C has or is configured to have a computing loading higher than that of the processing unit 40B, a number of the memory components accessed by the processing unit 40C may be greater than a number of the memory components accessed by the processing unit 40B. For example, the processing unit 40C having or configured to have a higher computing loading may access the memory components 30A, 30B, and 30C, and the processing unit 40B having or configured to have a lower computing loading may access the memory component 30D. Therefore, according to some arrangements of the present disclosure, data stored in all of the memory components can be accessed by all of the processing units according to the data volume required for each of the processing units, the flexibility of distribution of data for processing units is increased, the memory efficiency can be increased, and the computing speed and the computing capacity of the electronic device 1 can be increased.

Figure 2A:
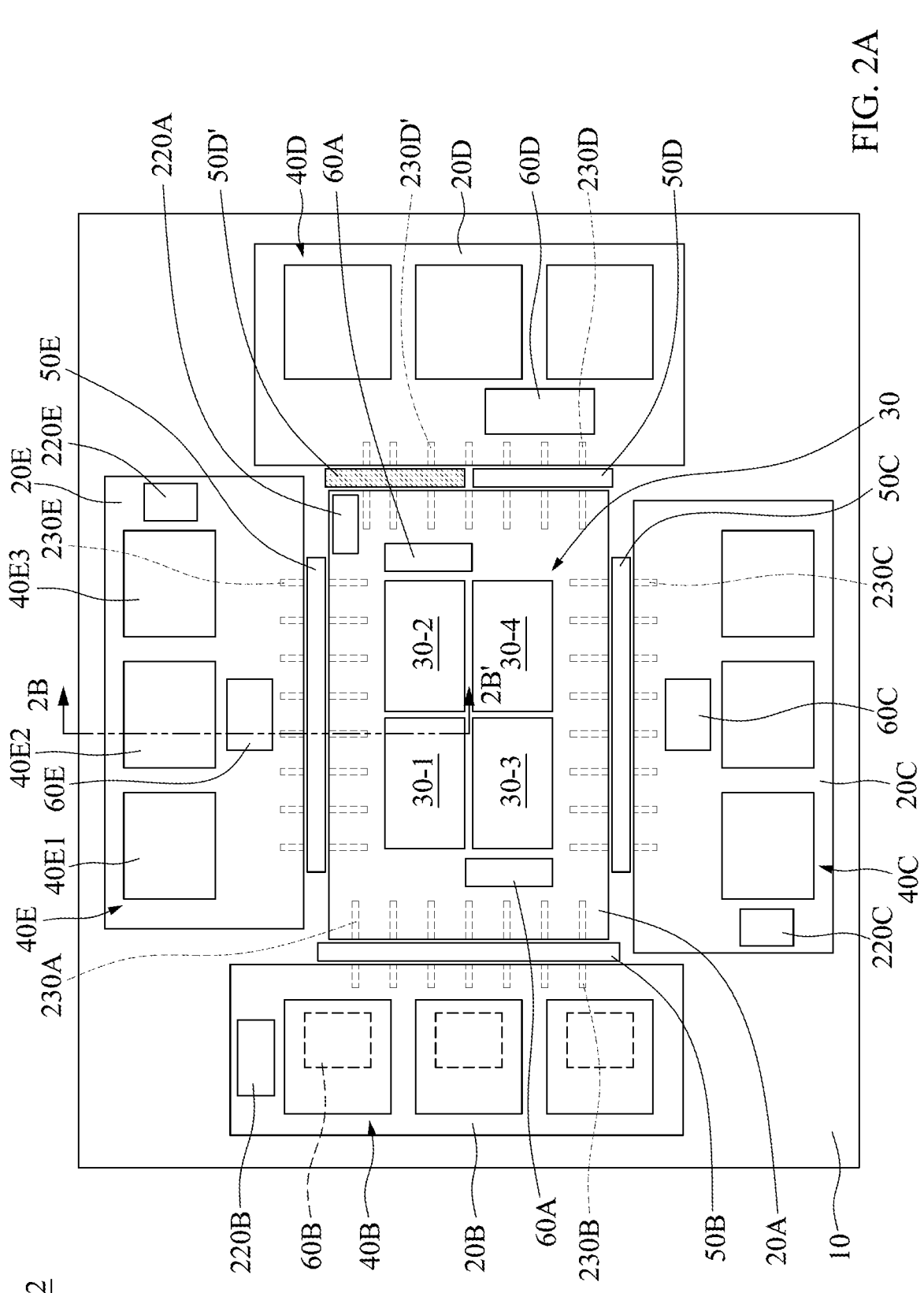
FIG. 2A is a top view of an electronic device in accordance with some arrangements of the present disclosure.
Figure 2B:
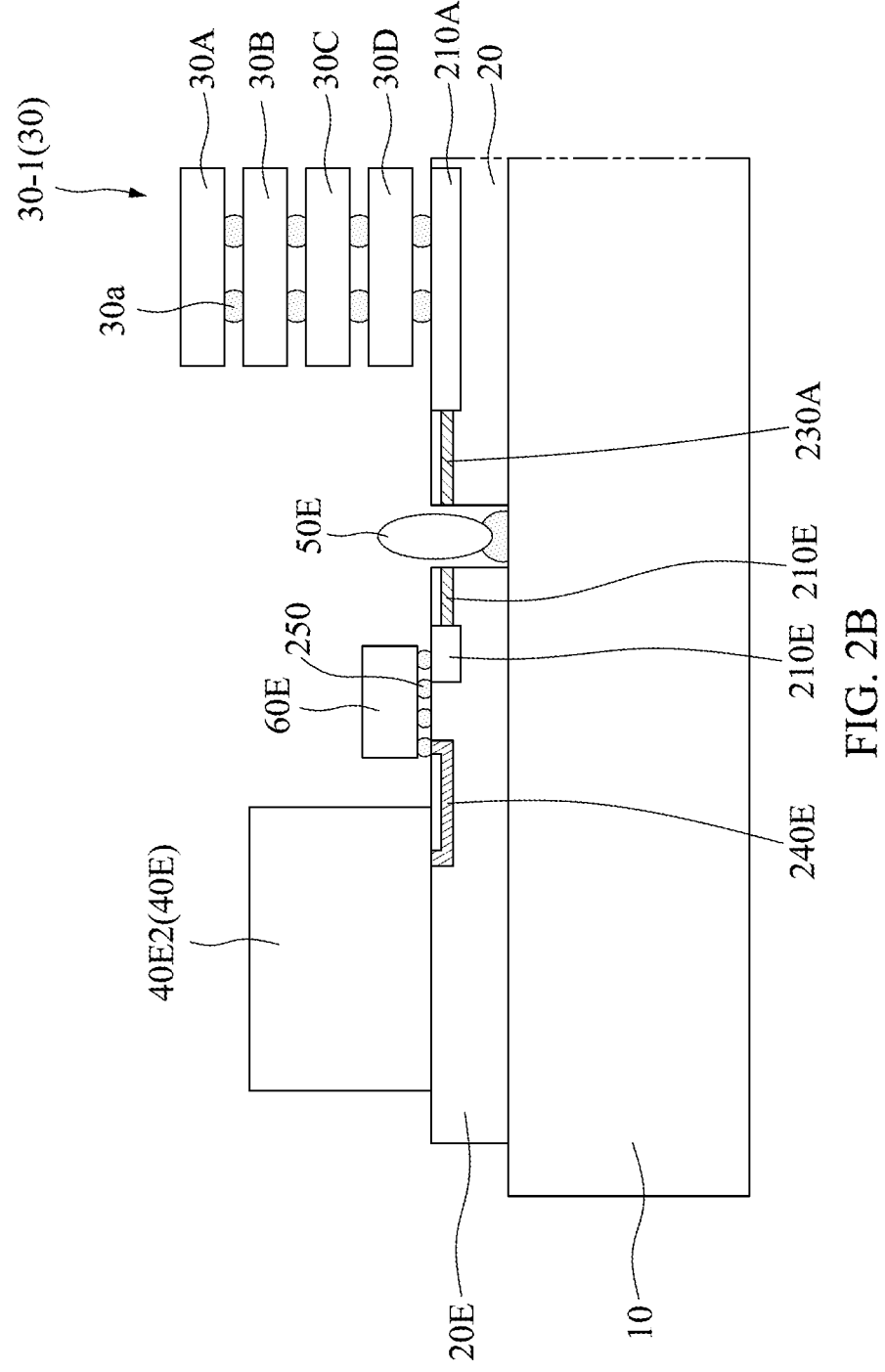
FIG. 2B is a cross-section of a portion of an electronic device in accordance with some arrangements of the present disclosure.

FIG. 2A is a top view of an electronic device 2 in accordance with some arrangements of the present disclosure. FIG. 2B is a cross-section of a portion of an electronic device 2 in accordance with some arrangements of the present disclosure. In some arrangements, FIG. 2B shows a cross-section along a line 2B-2B' in FIG. 2A. The electronic device 2 is similar to the electronic device 1 in FIG. 1A and FIG. 1B, and the differences therebetween are described as follows.

In some arrangements, the optical component 220A is disposed over the photonic component 20A and spaced apart from the photonic component 20D, and the optical component 220A is configured to provide an optical source signal to the photonic component 20A and an optical source signal to the photonic component 20D.

In some arrangements, the electronic device 2 further includes an optical connector 50D' between the photonic component 20A and the photonic component 20D. In some arrangements, the optical connector 50D' is configured to actively optically align the photonic component 20A to the photonic component 20D to provide the optical source signal from the optical component 220A to the photonic component 20D. According to some arrangements of the present disclosure, with the design of the optical connector 50D', the optical component 220A can serve as an optical source shared by the photonic components 20A and 20D, and thus a space reserved for an optical source over the photonic component 20D can be omitted.

In some arrangements, the memory module 30 includes a plurality of memory stacks 30-1, 30-2, 30-3, and 30-4, and each of the memory stacks includes a plurality of memory components 30A, 30B, 30C, and 30D. In some arrangements, when two processing units have or are configured to have different computing loadings, the processing unit having or configured to have a higher computing loading may access more memory stacks, and preferably access the memory stacks that are most adjacent to the processing unit having or configured to have the higher computing loading. For example, when the processing unit 40C having or configured to have a computing loading higher than that of the processing unit 40B, a number of the memory stacks accessed by the processing unit 40C may be greater than a number of the memory stacks accessed by the processing unit 40B. For example, the processing unit 40C having or configured to have a higher computing loading may access the memory stacks 30-2, 30-3, and 30-4, and the processing unit 40B having or configured to have a lower computing loading may access the memory stack 30-1. Therefore, according to some arrangements of the present disclosure, data stored in all of the memory stacks can be accessed by all of the processing units according to the data volume required for each of the processing units, the flexibility of distribution of data for processing units is increased, the memory efficiency can be increased, and the computing speed and the computing capacity of the electronic device 2 can be increased.

In some arrangements, when two processing units have or are configured to have different computing loadings, the processing unit having or configured to have a higher computing loading may access more memory stacks and more memory components in one of the memory stacks, and preferably access the memory stacks that are most adjacent to the processing unit having or configured to have the higher computing loading. For example, the processing unit 40C having or configured to have a higher computing loading may access the memory stacks 30-2, 30-3, and 30-4 and the memory components 30A and 30B of the memory stack 30-1, and the processing unit 40B having or configured to have a lower computing loading may access the memory components 30C and 30D of the memory stack 30-1. Therefore, according to some arrangements of the present disclosure, data stored in all of the memory components in all of the memory stacks can be accessed by all of the processing units according to the data volume required for each of the processing units, the flexibility of distribution of data for processing units is increased, the memory efficiency can be increased, and the computing speed and the computing capacity of the electronic device 2 can be increased.

In some arrangements, the electronic components 60A are disposed over and electrically connected to the photonic component 20A. The electronic component 60A and the photonic component 20A may collectively construct an optical engine.

In some arrangements, the electronic component 60E is disposed over and electrically connected to the photonic component 20E, and the processing components 40E1,

40E2, and 40E3 are not integrated with any electronic component. In some arrangements, the electronic component 60E is communicatively coupled to the electronic component 60A to determine which ones of the memory stacks 30-1, 30-2, 30-3, and 30-4 and which ones of the memory components 30A, 30B, 30C, and 30D in each of the memory stacks to be accessed by the processing components 40E1, 40E2, and/or 40E3, respectively. The electronic component 60E may serve as a controller to distribute the data from the memory module 30 to be accessed by the processing units that are operated. In some arrangements, the electronic component 60E is electrically connected to the photonic component 20E through connection elements 250 (e.g., conductive bumps). In some arrangements, the electronic component 60E is electrically connected to the processing component 40E2 through an electrically connection element 240E of the photonic component 20E. The electrically connection element 240E may include one or more conductive layers and one or more conductive vias.

Figure 3A:
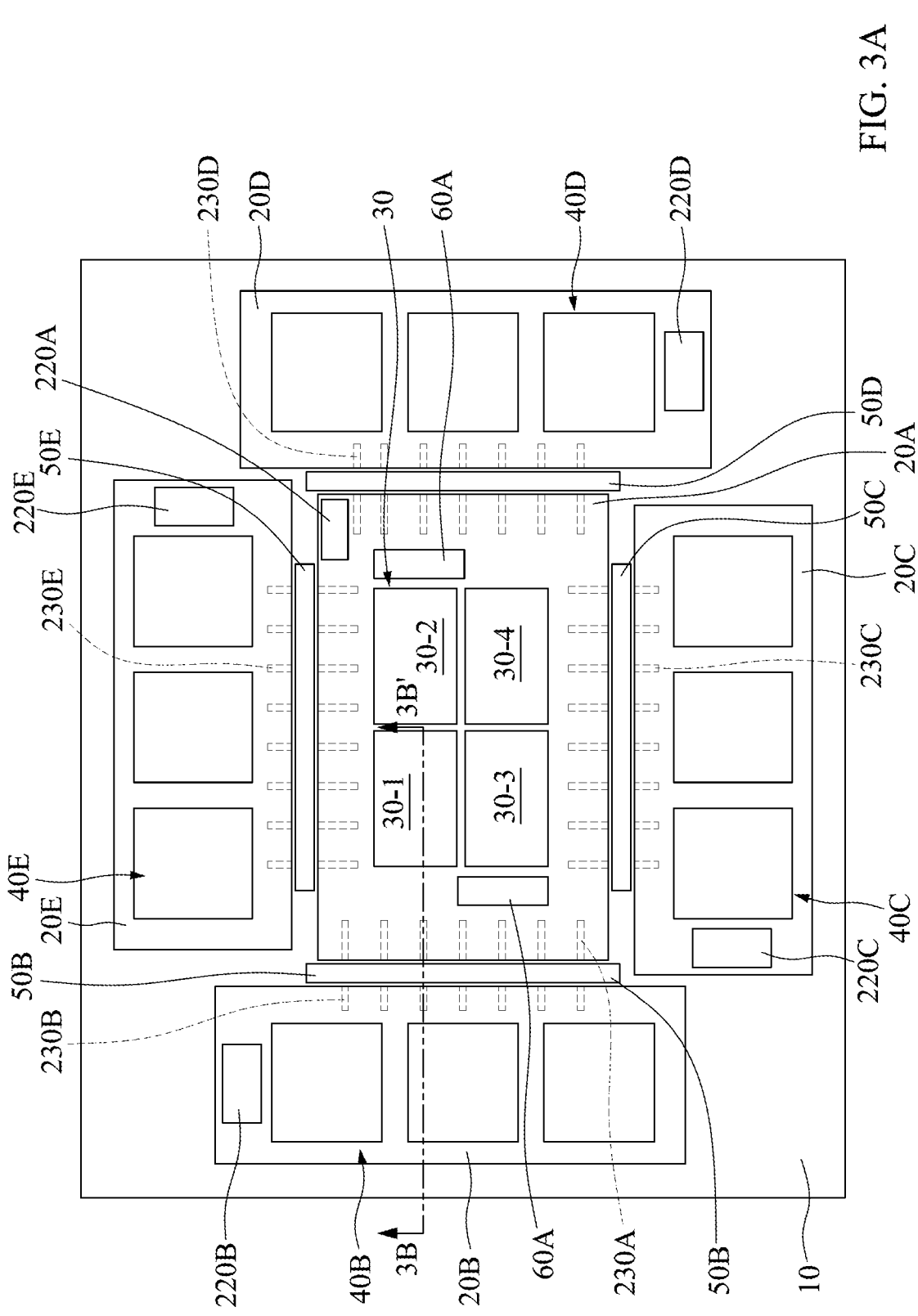
FIG. 3A is a top view of an electronic device in accordance with some arrangements of the present disclosure.
Figure 3B:
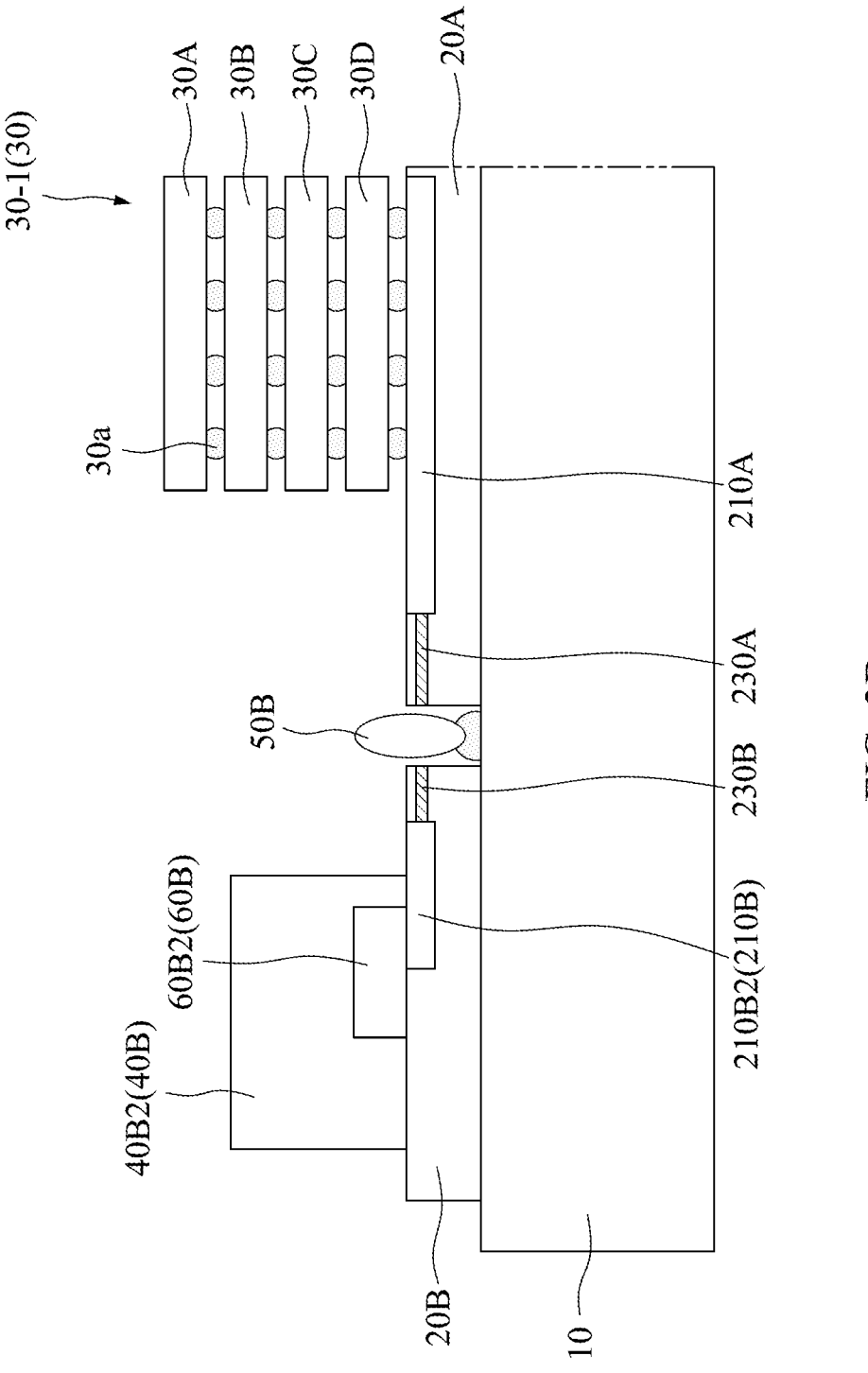
FIG. 3B is a cross-section of a portion of an electronic device in accordance with some arrangements of the present disclosure.

FIG. 3A is a top view of an electronic device 3 in accordance with some arrangements of the present disclosure. FIG. 3B is a cross-section of a portion of an electronic device 3 in accordance with some arrangements of the present disclosure. In some arrangements, FIG. 3B shows a cross-section along a line 3B-3B' in FIG. 3A. The electronic device 3 is similar to the electronic device 1 in FIG. 1A and FIG. 1B, and the differences therebetween are described as follows.

In some arrangements, the electronic device 3 is different from the electronic device 1 illustrated in FIG. 1A and FIG. 1B in that the electronic components 60A are not stacked with the memory components 30A, 30B, 30C, and 30D, and the memory module 30 includes memory stacks 30-1, 30-2, 30-3, and 30-4.

Figure 4A:
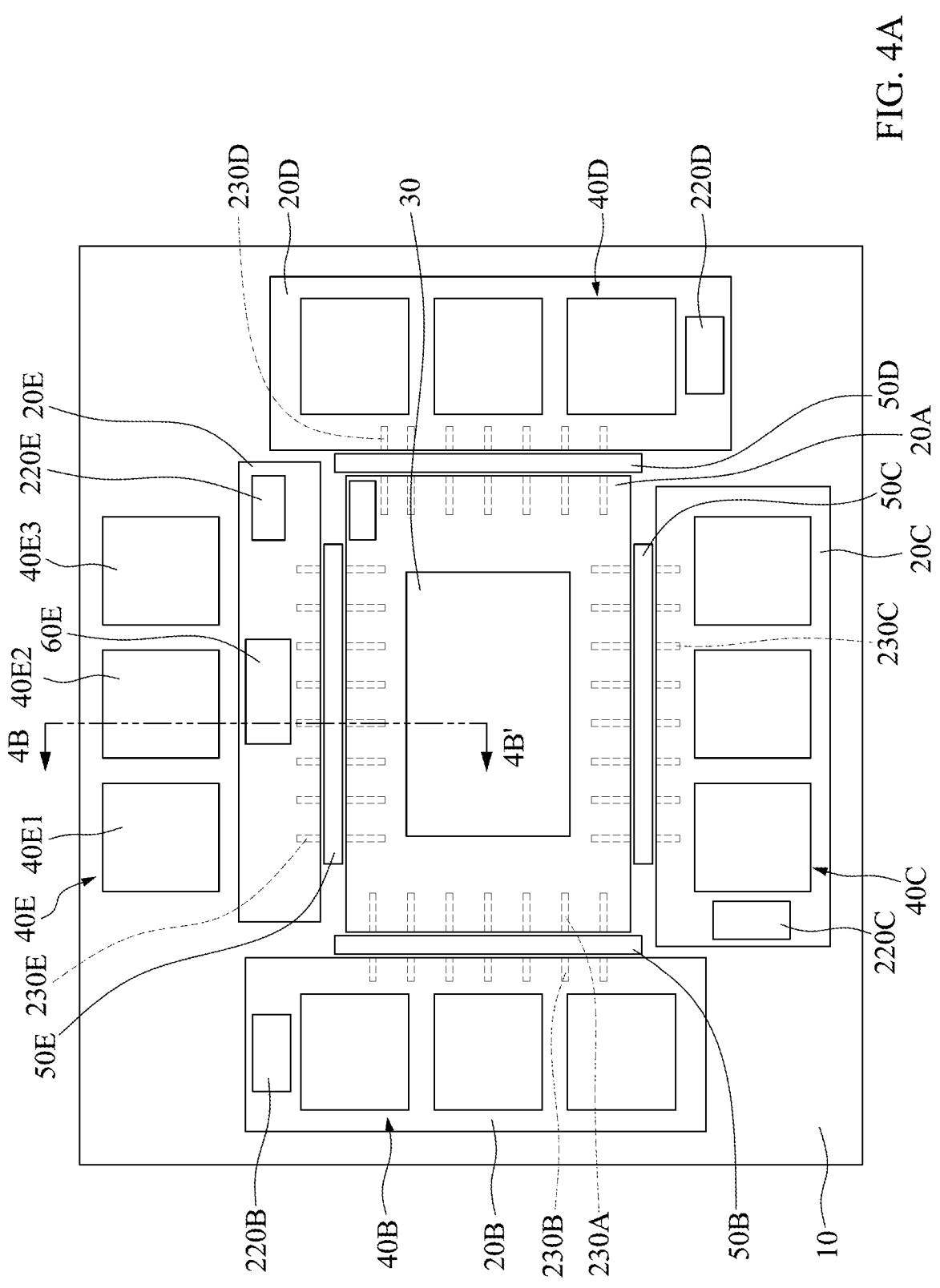
FIG. 4A is a top view of an electronic device in accordance with some arrangements of the present disclosure.
Figure 4B:
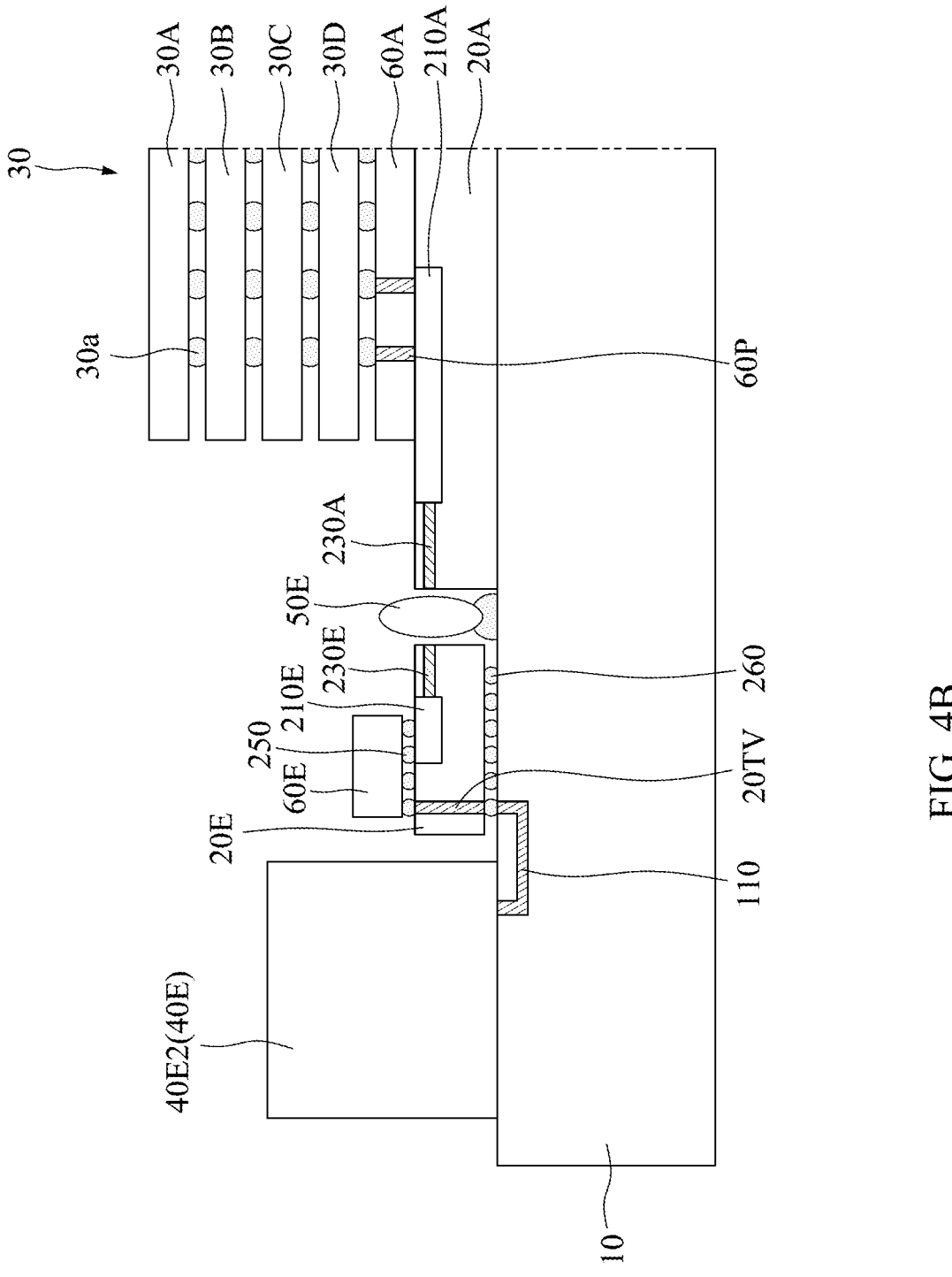
FIG. 4B is a cross-section of a portion of an electronic device in accordance with some arrangements of the present disclosure.

FIG. 4A is a top view of an electronic device 4 in accordance with some arrangements of the present disclosure. FIG. 4B is a cross-section of a portion of an electronic device 4 in accordance with some arrangements of the present disclosure. In some arrangements, FIG. 4B shows a cross-section along a line 4B-4B' in FIG. 4A. The electronic device 4 is similar to the electronic device 1 in FIG. 1A and FIG. 1B, and the differences therebetween are described as follows.

In some arrangements, the processing components 40E1, 40E2, and 40E3 are disposed over the carrier 10 and adjacent to the photonic component 20E, and the electronic component 60E is disposed over the electrically connected to the photonic component 20E. The electronic component 60E and the photonic component 20E may collectively construct an optical engine.

In some arrangements, the electronic component 60E is disposed over and electrically connected to the photonic component 20E, and the processing components 40E1, 40E2, and 40E3 are not integrated with any electronic component. In some arrangements, the electronic component 60E is communicatively coupled to the electronic component 60A to determine which ones of the memory stacks 30-1, 30-2, 30-3, and 30-4 and which ones of the memory components 30A, 30B, 30C, and 30D in each of the memory stacks to be accessed by the processing components 40E1, 40E2, and/or 40E3, respectively. The electronic component 60E may serve as a controller to distribute the data from the memory module 30 to be accessed by the processing units that are operated. In some arrangements, the electronic component 60E is electrically connected to the photonic component 20E through connection elements 250 (e.g., conductive bumps). In some arrangements, the photonic component 20E is electrically connected to the carrier 10 through connection elements 260 (e.g., conductive bumps). In some arrangements, the photonic component 20E includes a conductive pillar 20TV (or "a conductive pillar"), and the electronic component 60E is electrically connected to the processing component 40E2 through the conductive pillar 20TV and an electrically connection element 110 of the carrier 10. The photonic component 20E may have an active surface facing the electronic component 60E and electrically connected to the carrier 10 through the conductive pillar 20TV. The electrically connection element 110 may include one or more conductive layers and one or more conductive vias.

According to some arrangements of the present disclosure, the photonic component 20E connected to the electronic component 60E may collectively construct an integrated optical engine that electrically connects to the processing component through the carrier 10. Therefore, fewer components/elements are integrated with the photonic component 20E for directly electrically connecting to the processing component, and thus the manufacturing process for the photonic component 20E can be simplified.

Figure 4C:
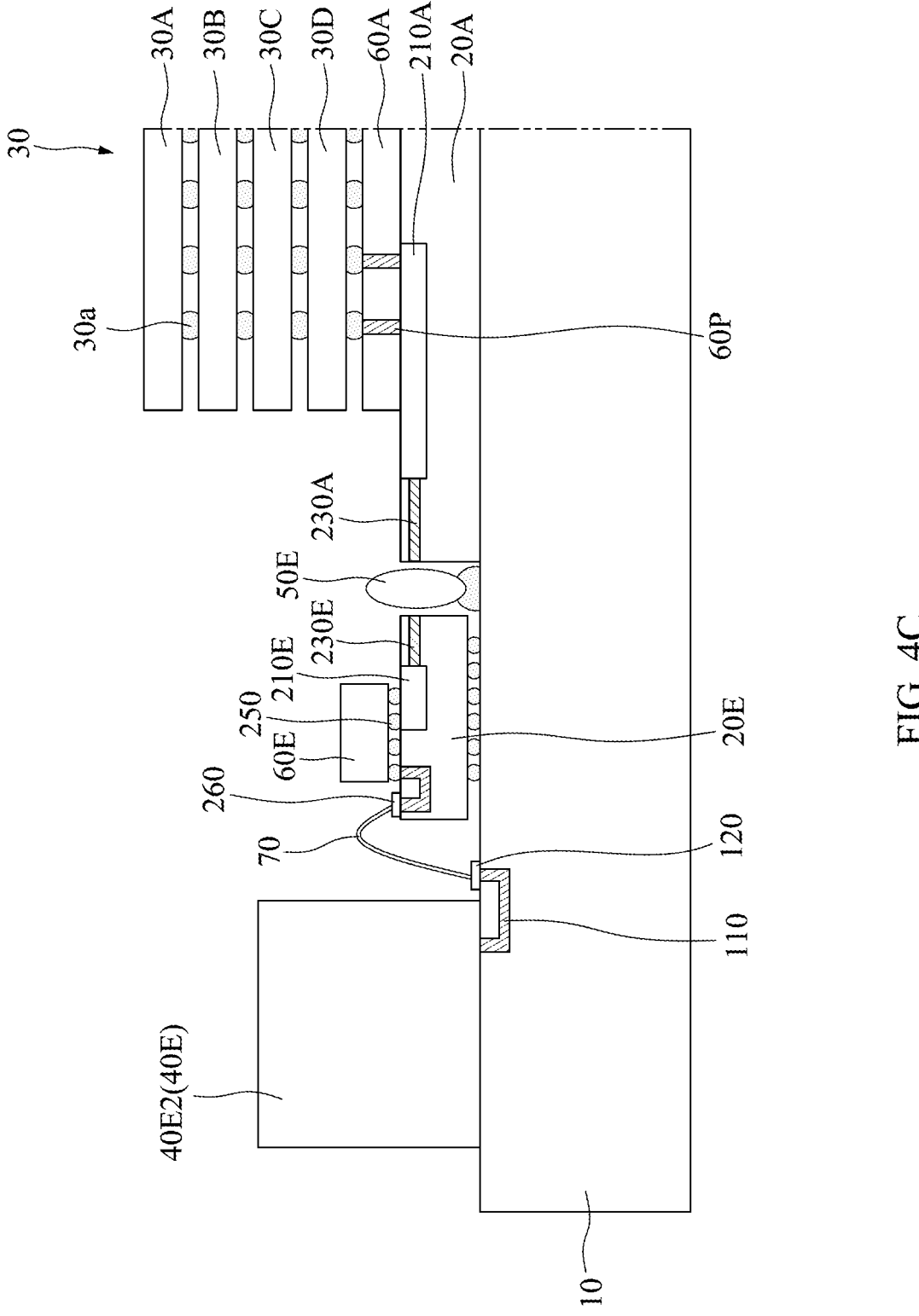
FIG. 4C is a cross-section of a portion of an electronic device in accordance with some arrangements of the present disclosure.

FIG. 4C is a cross-section of a portion of an electronic device 4 in accordance with some arrangements of the present disclosure. In some arrangements, FIG. 4C shows a cross-section along a line 4B-4B' in FIG. 4A.

In some arrangements, the electronic component 60E is electrically connected to the photonic component 20E through connection elements 250 (e.g., conductive bumps). In some arrangements, the photonic component 20E is electrically connected to the carrier 10 through connection elements 260 (e.g., conductive bumps). In some arrangements, the electronic component 60E is electrically connected to the processing component 40E2 through the electrically connection element 240E, a conductive pad 270, a conductive wire 70, a conductive pad 120, and the electrically connection element 110.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to +10% of that numerical value, such as less than or equal to +5%, less than or equal to +4%, less than or equal to +3%, less than or equal to +2%, less than or equal to +1%, less than or equal to +0.5%, less than or equal to +0.1%, or less than or equal to +0.05%. For example, a first numerical value can be deemed to be "substantially" the same or equal to a second numerical value if the first numerical value is within a range of variation of less than or equal to +10% of the second numerical value, such as less than or equal to +5%, less than or equal to +4%, less than or equal to +3%, less than or equal to +2%, less than or equal to +1%, less than or equal to +0.5%, less than or equal to +0.1%, or less than or equal to +0.05%. For example, "substantially" perpendicular can refer to a range of angular variation relative to 90° that is less than or equal to +10°, such as less than or equal to +5°, less than or equal to +4°, less than or equal to +3°, less than or equal to +2°, less than or equal to +1°, less than or equal to +0.5°, less than or equal to +0.1°, or less than or equal to +0.05°.

Two surfaces can be deemed to be coplanar or substantially coplanar if a displacement between the two surfaces is no greater than 5 μm, no greater than 2 μm, no greater than 1 μm, or no greater than 0.5 μm. A surface can be deemed to be substantially flat if a displacement between a highest point and a lowest point of the surface is no greater than 5 μm, no greater than 2 μm, no greater than 1 μm, or no greater than 0.5 μm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately 104 S/m, such as at least 105 S/m or at least 106 S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. An electronic device, comprising:
a first photonic component;
a memory module comprising a plurality of memory components supported by the first photonic component;
a plurality of processing units distributed at a periphery of the memory module, wherein the memory module is configured to be accessed by at least two of the processing units through the first photonic component;
a second photonic component electrically connected to at least one of the plurality of processing units and configured to optically couple to the first photonic component;
an optical component configured to provide a first optical source signal to the first photonic component and a second optical source signal to the second photonic component; and
an optical connector configured to actively optically align the first photonic component to the second photonic component to provide the second optical source signal to the second photonic component, wherein a distance between the optical connector and the first photonic component is less than a thickness of the optical connector.

2. The electronic device of claim 1, wherein each of the processing units is configured to access at least one of the memory components depending on a computing loading of the processing units.

3. The electronic device of claim 1, wherein when at least one of the processing units is not operated, all of the memory components are configured to be accessed by the other processing units that are operated, and none of the memory components becomes idle.

4. The electronic device of claim 2, wherein, when a first processing unit of the processing units having a higher computing loading than the other processing units, the first processing unit is configured to access the memory components that are most adjacent to the first processing unit.

5. The electronic device of claim 1, wherein the second photonic component is spaced apart from the first photonic component and comprises a conductive pillar passing through the second photonic component.

6. The electronic device of claim 1, wherein, in a cross-section, a height of the memory module is higher than a height of the first photonic component, and, in a top view, an area of the memory module is smaller than an area of the first photonic component.

7. The electronic device of claim 1, wherein the first photonic component is the only and single communication media for all of the processing units to access the memory module.

8. The electronic device of claim 1, wherein the optical component is disposed over the first photonic component and spaced apart from the second photonic component.

9. The electronic device of claim 1, wherein each of the processing units is configured to access at least one of the memory components depending on a required data volume of the processing units.

10. The electronic device of claim 1, wherein the first photonic component is configured as a centralized optical communication hub to allow each of the plurality of processing units distributed at the periphery to access the memory module.

11. The electronic device of claim 9, further comprising an electronic component configured to determine amounts of data stored in the memory components to be accessed by the processing units depending on a computing loading of the processing units, wherein the electronic component and the first photonic component collectively construct an optical engine.

12. The electronic device of claim 11, further comprising an electronic component is supported by the first photonic component, wherein the electronic component comprises a plurality of conductive pillars electrically connected to the memory module.

13. The electronic device of claim 1, further comprising a third photonic component spaced apart from the second photonic component and supporting at least one of the processing units, wherein a first distance between a first optical waveguide of the first photonic component and a second optical waveguide of the second photonic component is less than a second distance between the second optical waveguide of the second photonic component and a third optical waveguide of the third photonic component.

14. The electronic device of claim 1, wherein the optical connector comprises a lens structure which has a rectangular profile in a top view and has a curved profile in a cross-section.

15. An electronic device, comprising:
a memory module comprising a plurality of memory components; and
a first processing unit disposed adjacent to the memory module, wherein the first processing unit comprises a first processing component and a second processing component configured to access different ones of the memory components through optical communication which is operated by the following:
a first photonic component supporting and electrically connected the memory module;
a second photonic component supporting and electrically connected to the first processing unit; and
an optical connector configured to passively optically align the first photonic component to the second photonic component, wherein a distance between the optical connector and the first photonic component is less than a thickness of the optical connector.

16. The electronic device of claim 15, wherein, in a cross-section, a height of the memory module is higher than a height of the first photonic component, and, in a top view, an area of the memory module is smaller than an area of the first photonic component.

17. The electronic device of claim 16, further comprising a third photonic component spaced apart from the second photonic component and a second processing unit supported by the third photonic component, wherein a first distance between a first optical waveguide of the first photonic component and a second optical waveguide of the second photonic component is less than a second distance between second optical waveguide of the second photonic component and a third optical waveguide of the third photonic component.

18. An electronic device, comprising:
a carrier;
a memory module over the carrier; and
a plurality of processing units over the carrier, wherein the memory module is configured to be accessed by each of the processing units through optical communication which is operated by the following:
a first photonic component supporting and electrically connected the memory module;
a second photonic component supporting and electrically connected to at least one of the processing units; and
an optical connector configured to passively optically align the first photonic component to the second photonic component, wherein a distance between the optical connector and the first photonic component is less than a thickness of the optical connector.

19. The electronic device of claim 18, wherein the memory module is disposed over a center region of the carrier and comprises a plurality of memory stacks each comprising a plurality of memory components, the processing units comprise a first processing unit and a second processing unit configured to have a computing loading higher than that of the first processing unit, and a number of the memory stacks accessed by the second processing unit is greater than a number of the memory stacks accessed by the first processing unit, wherein the memory module is located between the first processing unit and the second processing unit.

20. The electronic device of claim 18, wherein, in a cross-section, a height of the memory module is higher than a height of the first photonic component, and, in a top view, an area of the memory module is smaller than an area of the first photonic component.

* * * * *